(12) United States Patent
Montgomery et al.

(10) Patent No.: US 7,704,462 B2
(45) Date of Patent: Apr. 27, 2010

(54) METHOD AND APPARATUS FOR PRODUCING ALIGNED CARBON NANOTUBE THERMAL INTERFACE STRUCTURE

(75) Inventors: Stephen W. Montgomery, Federal Way, WA (US); Tomm V. Aldridge, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 1380 days.

(21) Appl. No.: 11/104,354

(22) Filed: Apr. 12, 2005

(65) Prior Publication Data

US 2006/0054490 A1 Mar. 16, 2006

Related U.S. Application Data

(62) Division of application No. 10/024,057, filed on Dec. 17, 2001, now Pat. No. 6,921,462.

(51) Int. Cl.
*B01J 19/08* (2006.01)
(52) U.S. Cl. .................................. 422/186.04
(58) Field of Classification Search ............. 422/186.04
See application file for complete search history.

(56) References Cited

U.S. PATENT DOCUMENTS

| | | | |
|---|---|---|---|
| 4,169,911 A | 10/1979 | Yoshida et al. | |
| 5,102,824 A | 4/1992 | Neugebauer et al. | |
| 5,316,080 A | 5/1994 | Banks et al. | |
| 5,580,512 A * | 12/1996 | Koon et al. | 264/438 |
| 5,604,037 A | 2/1997 | Ting et al. | |
| 5,825,624 A | 10/1998 | Arnold et al. | |
| 5,837,081 A | 11/1998 | Ting et al. | |
| 5,904,977 A * | 5/1999 | Reitz | 428/304.4 |
| 5,965,257 A | 10/1999 | Ahluwalia | |
| 5,965,267 A | 10/1999 | Nolan et al. | |
| 5,972,265 A | 10/1999 | Marra et al. | |
| 6,312,303 B1 | 11/2001 | Yaniv et al. | |
| 6,407,922 B1 | 6/2002 | Eckblad et al. | |
| 6,504,292 B1 | 1/2003 | Choi et al. | |
| 6,630,772 B1 | 10/2003 | Bower et al. | |

(Continued)

FOREIGN PATENT DOCUMENTS

EP 0538798 4/1993

(Continued)

OTHER PUBLICATIONS

Andrews, R., et al., "Nanotube Composite Carbon Fibers", *Applied Physics Letters*, 75(9), (Aug. 30, 1999),1329-1331.

(Continued)

*Primary Examiner*—Kishor Mayekar
(74) *Attorney, Agent, or Firm*—Schwegman, Lundberg & Woessner, P.A.

(57) ABSTRACT

The invention relates to a method and apparatus for producing aligned carbon nanotube thermal interface structures using batch and continuous manufacturing processes. In a batch process a capacitor is immersed in a bath containing a slurry of thermoplastic polymer containing randomly oriented carbon nanotubes and energized to create an electrical field to orient the carbon nanotubes prior to curing. In a continuous process, slurry carried by a conveyor receives the nanotube aligning electric field from capacitors positioned on both sides of the conveyor bearing the slurry.

4 Claims, 6 Drawing Sheets

U.S. PATENT DOCUMENTS

| | | |
|---|---|---|
| 6,651,736 B2 | 11/2003 | Chiu et al. |
| 6,856,016 B2 | 2/2005 | Searls et al. |
| 6,921,462 B2 | 7/2005 | Montgomery et al. |
| 6,924,211 B2 | 8/2005 | Yamazaki et al. |
| 6,989,325 B2 | 1/2006 | Uang et al. |
| 7,109,581 B2 | 9/2006 | Dangelo et al. |
| 7,168,484 B2 | 1/2007 | Zhang et al. |
| 7,180,174 B2 | 2/2007 | Koning et al. |
| 7,456,052 B2 | 11/2008 | White et al. |
| 2002/0105071 A1 | 8/2002 | Mahajan et al. |
| 2002/0117659 A1 | 8/2002 | Lieber et al. |
| 2002/0175408 A1 | 11/2002 | Majumdar et al. |
| 2003/0077478 A1 | 4/2003 | Dani et al. |
| 2003/0117770 A1 | 6/2003 | Montgomery |
| 2003/0135971 A1 | 7/2003 | Liberman et al. |
| 2003/0179559 A1 | 9/2003 | Engelhardt et al. |
| 2003/0231471 A1 | 12/2003 | De Lorenzo et al. |
| 2004/0005736 A1 | 1/2004 | Searls et al. |
| 2004/0150100 A1 | 8/2004 | Dubin et al. |
| 2004/0152240 A1 | 8/2004 | Dangelo |
| 2004/0164390 A1 | 8/2004 | Wang |
| 2004/0265489 A1 | 12/2004 | Dubin |
| 2005/0093120 A1 | 5/2005 | Millik et al. |
| 2005/0126766 A1 | 6/2005 | Lee et al. |
| 2005/0139642 A1 | 6/2005 | Koning et al. |
| 2005/0139991 A1 | 6/2005 | White et al. |
| 2005/0260453 A1 | 11/2005 | Jiao et al. |
| 2007/0119582 A1 | 5/2007 | Zhang et al. |
| 2009/0075430 A1 | 3/2009 | White et al. |

FOREIGN PATENT DOCUMENTS

| | | |
|---|---|---|
| EP | 0689244 | 12/1995 |
| EP | 1054036 | 11/2000 |
| EP | 1109218 | 6/2001 |
| WO | WO-00/33628 | 6/2000 |
| WO | WO-01/30694 | 5/2001 |
| WO | WO-01/92381 | 12/2001 |

OTHER PUBLICATIONS

Bellar, R J., et al., "High Conduction Thermal Interface Material", *IBM Technical Disclosure Bulletin*, 36 (10), (Oct. 1, 1993),581-583.

Zhang, Y., et al., "Formation of metal nanowires on suspended single-walled carbon nanotubes", *Applied Physics Letters*, 77(19), (Nov. 6, 2000),3015-3017.

\* cited by examiner

METHOD AND APPARATUS FOR PRODUCING ALIGNED CARBON NANOTUBE THERMAL INTERFACE STRUCTURE

RELATED APPLICATION(S)

This application is a Divisional of U.S. application Ser. No. 10/024,057, now U.S. Pat. No. 6,921,462 filed on Dec. 17, 2001 which is incorporated herein by reference.

FIELD OF THE INVENTION

The present invention relates generally to providing cooling solutions to electronic circuits, and, more specifically, to methods and apparatus for the fabrication of a thermal interface structure using carbon nanotubes to improve thermal performance of a die containing an electronic circuit.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a process of forming a thermal interface structure having aligned carbon nanotubes embedded in a polymer interstitial material. More specifically, it relates to processes for aligning carbon nanotube fibers suspended in a slurry of nanotubes and liquid polymer and curing the aligned composite to form a billet which can be formed into a thermal interface structure. The use of aligned carbon nanotube fibers in the thermal interface structure provides a thermal interface structure having high thermal conductivity. The thermal interface structure may be used, for example to provide a highly thermally conductive path between a surface of an electronic circuit and a surface of a cooling solution such as a heat sink.

Arrays of nano tubes are being currently manufactured by Nano-Lab, Inc. using a high temperature chemical vapor deposition process. Such arrays are manufactured on a one at a time basis at a high temperature which makes deposition of the nanotubes directly on a processor die unfeasible. The nanotubes in the arrays are primarily multi-walled and therefore do not have the purity and exceptional thermal conductivity of single-walled nanotubes. It is desired to provide a batch type or continuing manufacturing process for thermal interface structures which allows for control of the quality of the polymer and the nanotubes.

Figure 1:
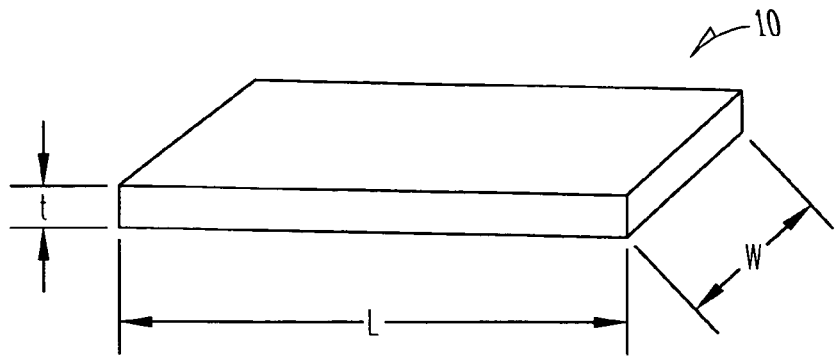
FIG. 1 is a perspective view of an embodiment of a thermal interface structure manufactured in accordance with the present invention.

FIG. 1 is a perspective view of a thermal interface structure 10 formed in accordance with the present invention. Thermal interface structure 10 has a length L and a width W and a thickness t as shown in FIG. 1. In practice, the length L and width W of thermal interface structure 10 are selected to provide a substantial heat exchange surface while falling within the outlines of the exposed surface of the electronic circuit such as a semiconductor die which is to be cooled. In one embodiment the length and width are 2 cm and 1 cm. Although in the present embodiment the structure 10 is shown in a highly regular form, for the purposes of illustration, it need not necessarily be as regular as shown.

The thickness t of the thermal interface structure 10, in one embodiment, may be limited by the length of the carbon nanotubes available. In one embodiment it may fall within a range of about 5 to 20 microns. Single-walled nanotubes manufactured using varied processes are available. Such nanotubes may be manufactured having varying lengths. Of course, increasing the length of the nanotubes and the thickness of the thermal interface structure 10 will increase the thermal impedance of the path between the die and the heat sink. Because of the exceptionally high thermal conductivity of single-walled carbon nanotubes, however, there is little to be gained by attempting to limit the thickness of the thermal interface structure to a thickness less than the range of lengths of the particular microtubes that are available using currently available manufacturing processes.

Figure 2:
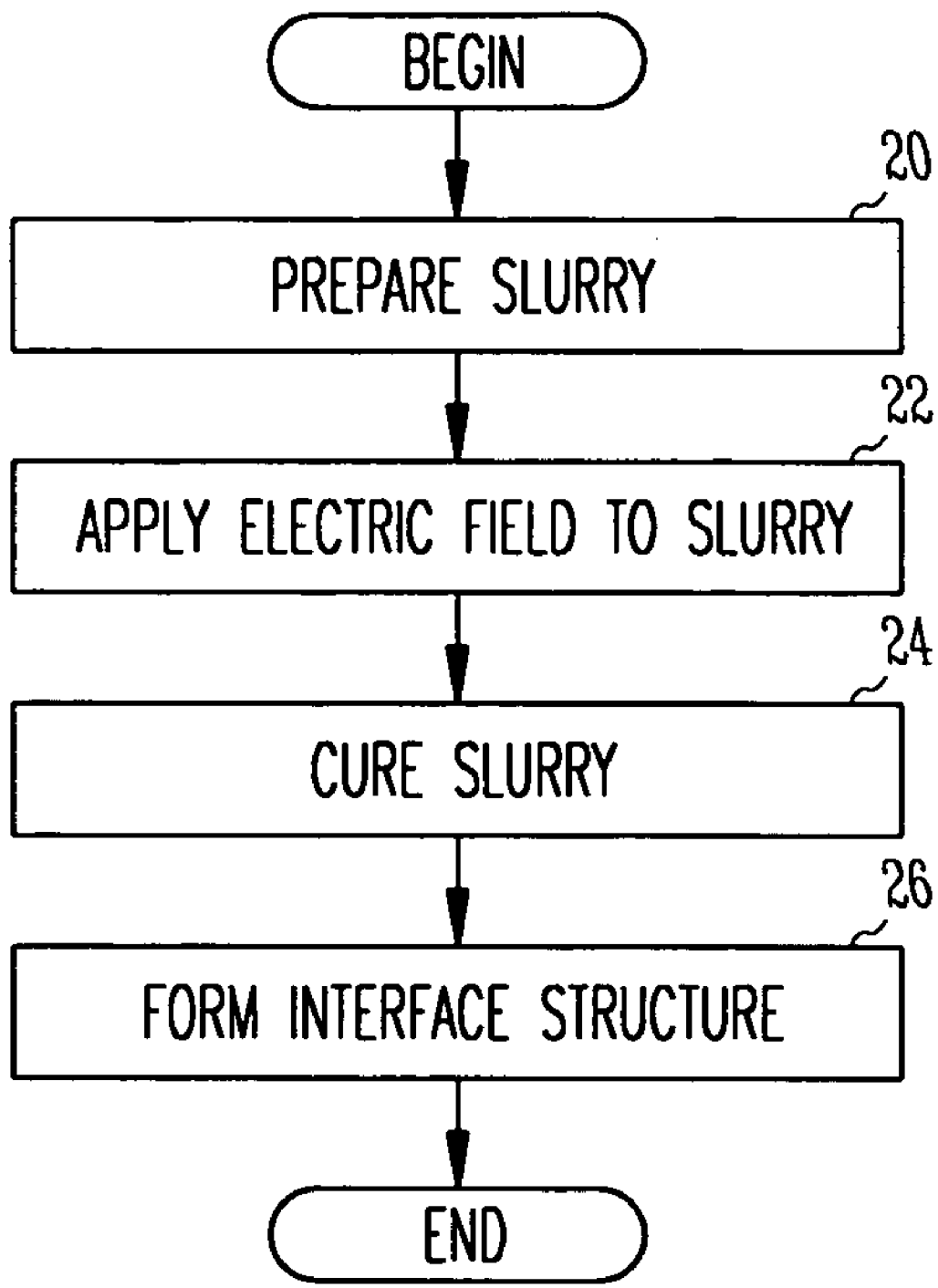
FIG. 2 is a is a process flow chart of the present invention.

FIG. 2 is a flow chart of an embodiment of a process of the present invention. The process begins in block 20 with preparing a slurry of a polymeric interstitial material and a quantity of randomly oriented carbon nanotubes. In block 22 an electrical field is applied to the slurry to align the carbon nanotubes with the direction of the electrical field. After aligning the carbon nanotubes, the slurry is cured in block 24 and the resulting billet of cured material is cut or otherwise formed into completed thermal interface structures 10 in block 26 by cutting or similar forming processes. In one embodiment, the resulting billet is used as thermal interface structure 10 without further cutting or other forming.

Figure 3:
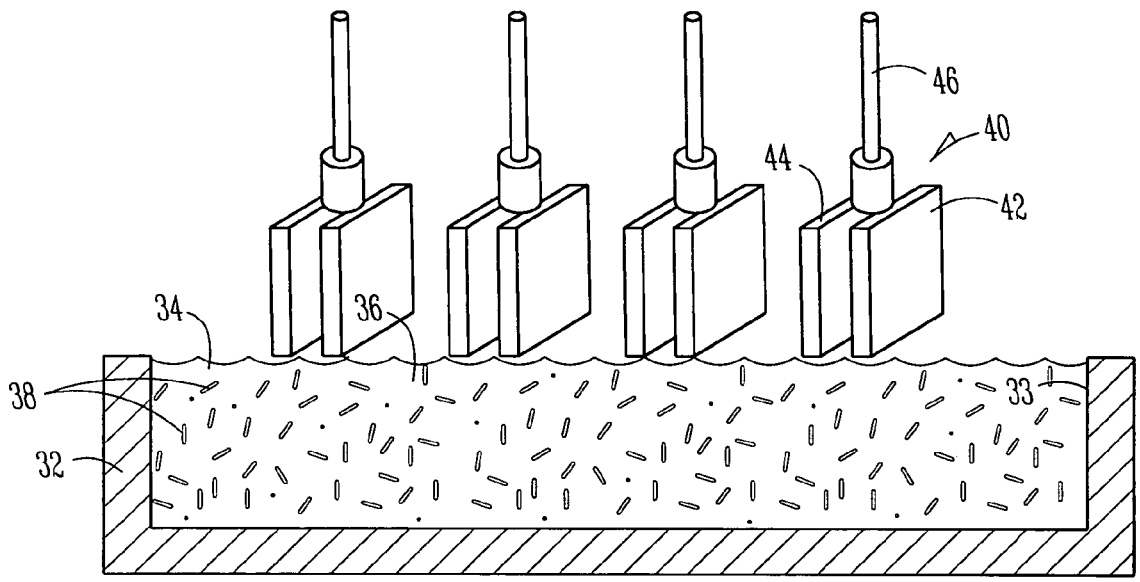
FIG. 3 is an illustrative elevational schematic of apparatus for fabricating thermal interface structures including a vat containing a monodisperse slurry of polymer and nanotubes and movable and adjustable capacitors positioned for insertion into the slurry; according to an embodiment of the present invention.

FIG. 3 illustrates apparatus according to an embodiment of the manufacturing process of FIG. 2 for making the thermal interface structure 10 of the present invention. A vat 32, the walls 33 of which are illustrated in cross-section, is filled with a composite monodispersed slurry 34 which is comprised of interstitial material 36 in liquid form and a plurality of single walled carbon nanotubes 38. The carbon nanotubes 38 can be produced in accordance with a number of manufacturing processes and then formed into thermal interface structures 10 in accordance with embodiments of the present invention. The present invention provides a way to orient nanotubes 38 for optimal thermal conductivity characteristics of the resulting thermal interface structure 10. Some embodiments of the present invention do not require operations to be carried out at the high temperatures inherent in chemical vapor deposition processes which are necessary to formation of aligned nanotubes directly on substrate surfaces. Batch or continuous processes in accordance with the present invention provide advantages over the production of thermal interface structures by forming aligned nanotubes directly on substrates.

In one embodiment, the interstitial material 36 is a polymer. In one embodiment polymer 36 is selected from the group of thermoplastic polymers selected from the group consisting of polycarbonate, polypropylene, polyacetal, polyoxymethylene and polyformaldehyde. Other suitable thermoplastic polymers can also be used.

Slurry 34 contains nanotubes 38 in monodisperse form, that is to say in a form having the lowest and narrowest possible dimensional scatter about a given nanotube length. Merely providing nanotubes 38 in a randomly oriented form in the monodisperse slurry 34 does not provide for optimal thermal conductivity characteristics in the polymeric matrix material 34. Accordingly, it is necessary to provide for the orienting of nanotubes 38 in the interstitial material 36 prior to curing the slurry 34 into a billet 10 of thermal interface material.

The apparatus shown in FIG. 3 provides for such orientation of the carbon nanotubes 38 in the thermal interface material. In the batch forming process apparatus shown in FIG. 3, vat 32 has a plurality of capacitors 40 associated with it for carrying out a batch process as illustrated in FIGS. 4 through 9 for forming thermal interface structures 10 having a preferred thermal path defined by aligned nanotube fibers.

Capacitors 40 are, in the embodiment illustrated, parallel plate capacitors with pairs of plates 42, 44. Each capacitor is, in the embodiment shown in FIG. 3, suspended from a movable transport mechanism 46 (shown simply as a rod in FIG. 3) for lowering each capacitor 40 into the slurry 34 of interstitial polymer 36 and randomly aligned nanotubes 38. Capacitor plates 42 and 44 are sized with their surface area dimensions selected so that one or more thermal interface structures 10 having width W and length L can be formed between a pair of plates. In addition to being movable vertically into and out of the slurry 34 in vat 32, plates 42 and 44 are also adjustable toward and away from each other while maintaining their parallel orientation relative to each other.

Figure 4:
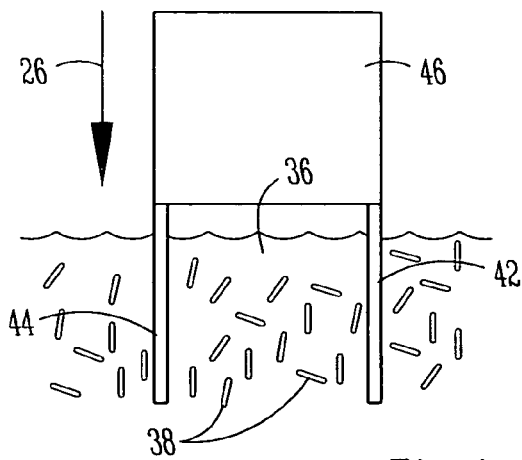
FIGS. 4 through 9 are illustrative elevational schematics of a typical capacitor, in the apparatus depicted in FIG. 1, at various stages of manufacture in accordance with an embodiment of a manufacturing process.
Figure 5:
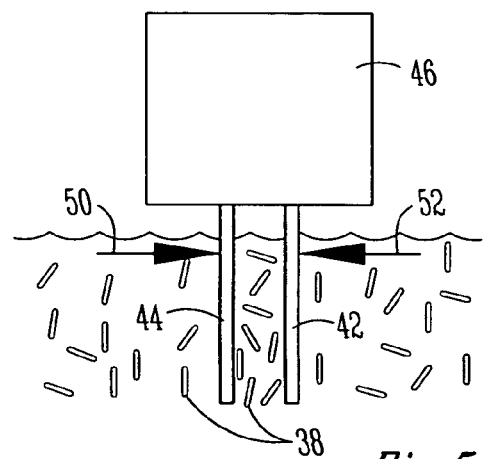

In accordance with a first portion of the manufacturing process, FIG. 4 shows, in a side elevation view, the edges of capacitor plates 42 and 44 being moved in a direction aligned with arrow 26 into slurry 34. After insertion of the plates 42 and 44 of capacitor 40 into the slurry in FIG. 4, plates 42 and 44 are adjusted relative to each other to move them toward each other in the directions shown by arrows 50 and 52 respectively of FIG. 5. It will be understood that relative movement of the plates toward each other by mechanism 46 may be achieved by moving of one or both of the plates 42, 44 toward each other. It is understood that it is a matter of design choice whether one or both of the plates are actually moved.

Figure 6:
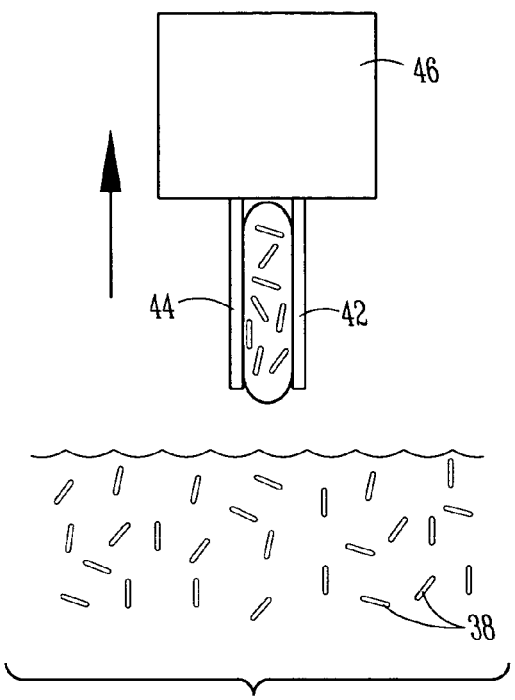
Figure 7:
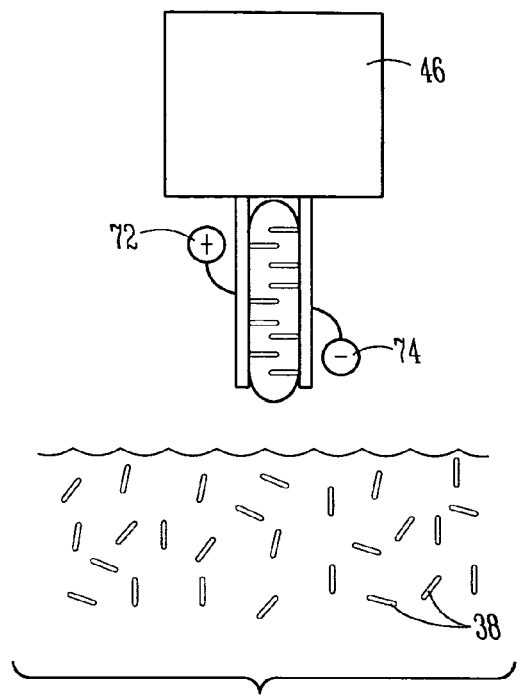

Once the plates 42 and 44 are adjusted to the desired spacing between them to provide a particular film thickness, the plates are withdrawn from the bath as shown in FIG. 6. A charge of the slurry 34 remains between the plates 42 and 44 of capacitor 40 due to the effect of surface tension of the liquid polymer interstitial material 36. After the plates 42, 46 are removed from the slurry 34 in the vat 32, plates 42 and 44 are connected to an appropriate voltage source to apply an electrostatic electric field between the plates as shown schematically in FIG. 7 by the positive and negative polarity symbols 72 and 74. The electrostatic field has the effect of aligning the carbon nanotubes in the slurry between the plates. The orientation of the aligned nanotubes is the same as the electric field so that the nanotubes are substantially perpendicular to capacitor plates 42 and 44.

Figure 8:
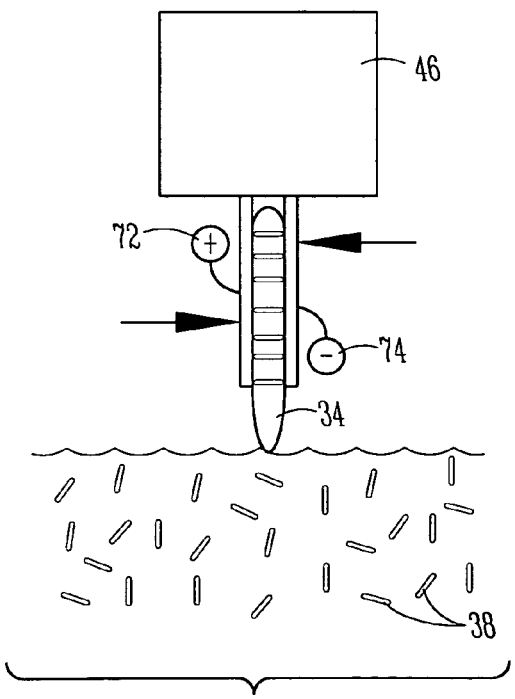
Figure 9:
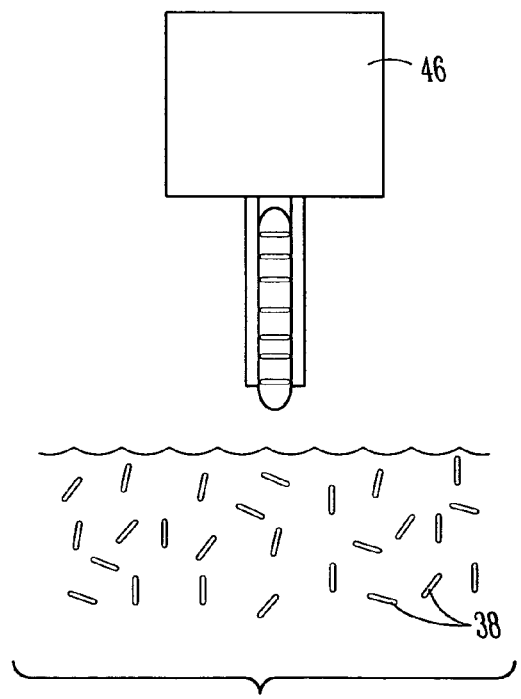

While the electric field is being applied and the nanotubes come into alignment, plates 42 and 44 may be brought closer together, as shown in FIG. 8, to squeeze out excess polymer 36 before commencing a curing phase which is commenced, in one embodiment, while the field is still being applied to assure that the nanotubes 38 remain properly oriented as curing commences. Curing is carried out, in one embodiment, by applying ultraviolet illumination to the composite material. In another embodiment, it is commenced by spraying a curing fluid on the material. In one embodiment, the curing is commenced while the field continues to be applied. In another embodiment, the field can be removed and curing thereafter commenced by relying upon the fact that the slurry has sufficient viscosity to hold the aligned nanotubes in an aligned orientation for a sufficient time period to carry out the curing to permanently hold the nanotubes in alignment.

At the completion of the curing phase, plates 42 and 44 are adjusted to open the gap between them to allow access to the billet of material which can in one embodiment be utilized in the form it is when removed or, in another embodiment, can be cut into a thermal interface structure 10 having the desired shape and dimensions.

Figure 10:
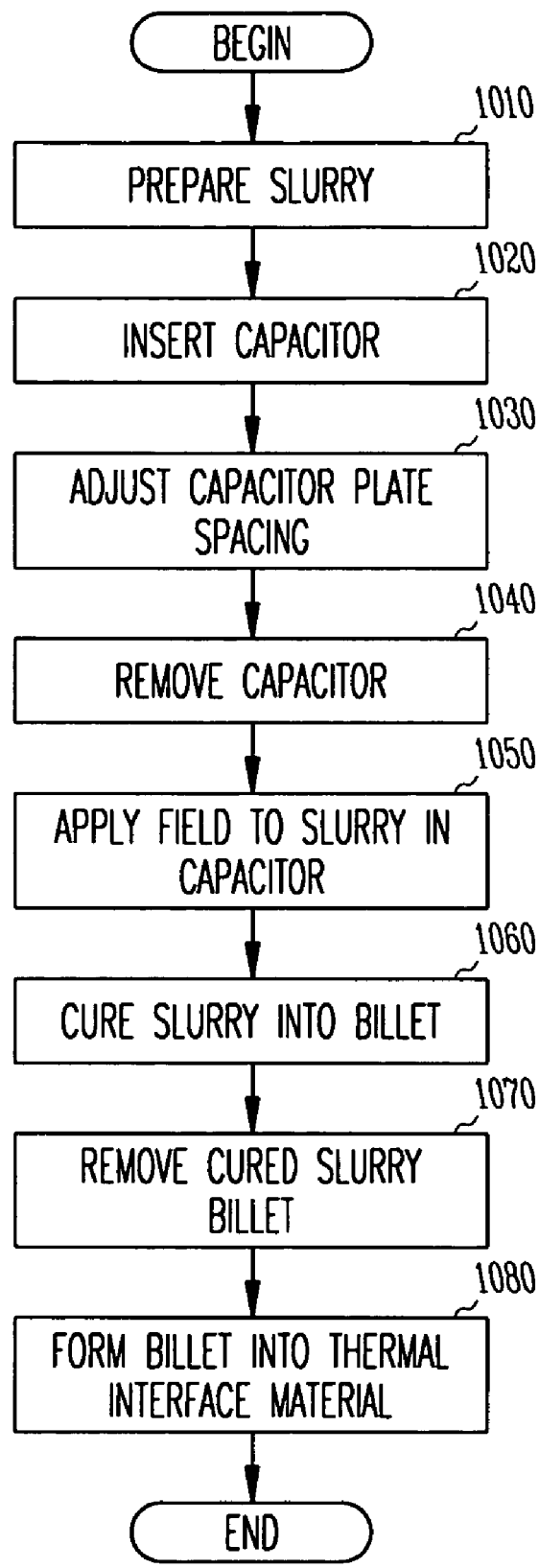
FIG. 10 is a process flow chart of the embodiment of the invention shown in FIGS. 3 through 9.

FIG. 10 is a flow chart showing the process carried out by the embodiment illustrated in FIGS. 3 through 9. In block 1010 a slurry of carbon nanotubes and polymer is prepared. In block 1020 one or more capacitors are inserted into the slurry and the spacing of the plates of the capacitor is adjusted in block 1030. The adjusted capacitor is removed from the slurry with a charge of slurry in block 1040 and an electrostatic electrical field is applied across the plates of the capacitor in block 1050. The slurry with aligned carbon nanotubes is then cured in block 1060 and the cured billet is removed from between the plates of the capacitor in block 1070. Finally the billet is, in one embodiment, formed into a thermal interface structure in block 1080. In another embodiment, the billet can be used as the thermal interface structure without further forming.

Figure 11:
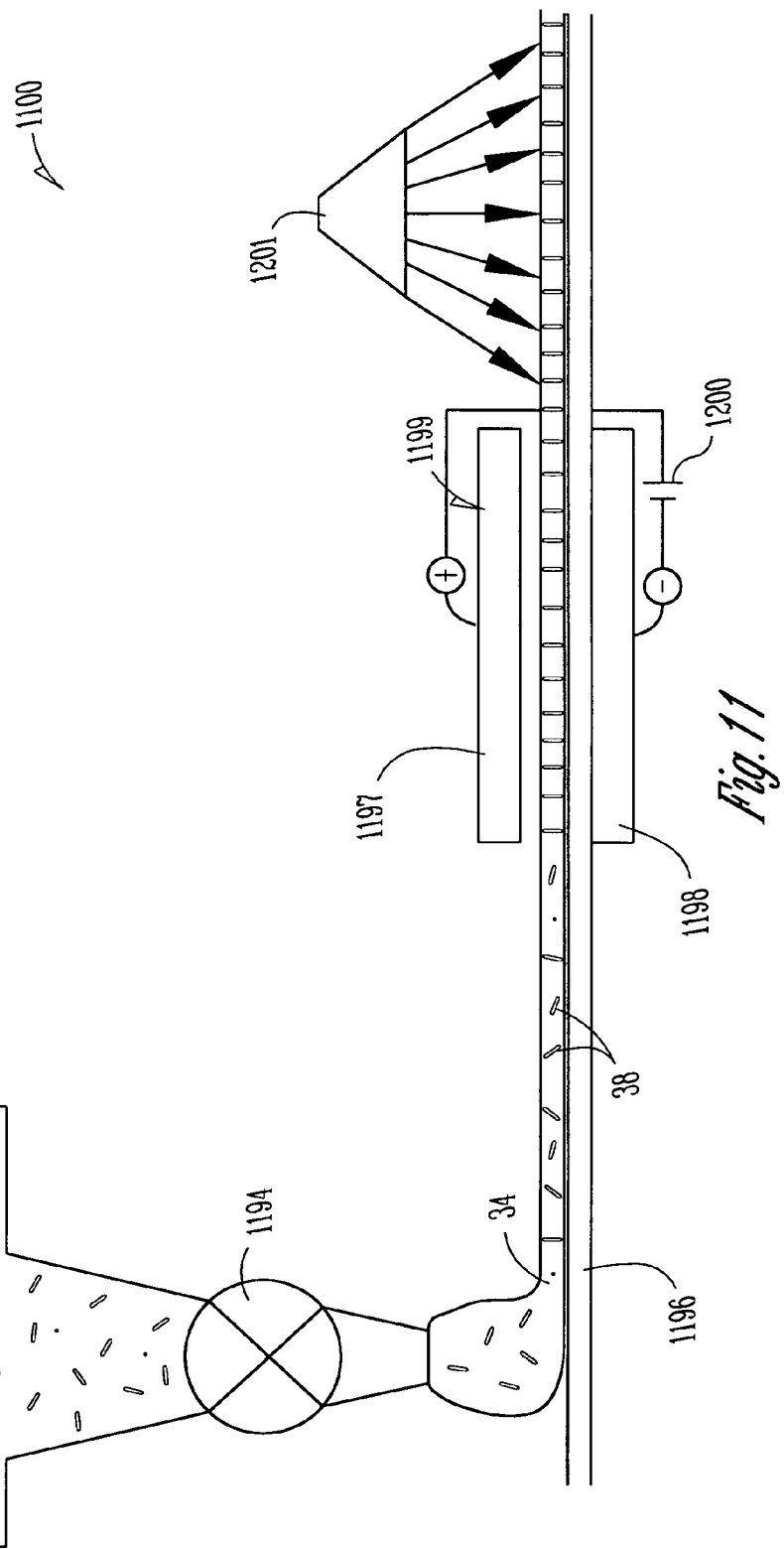
FIG. 11 is an illustrative elevational schematic of an a different apparatus for manufacturing thermal interface structures according to another embodiment of the invention.

FIG. 11 illustrates a different machine 1100, used in a continuous forming process according to a further embodiment of the invention. A hopper 1192 is loaded with a slurry 34 which is comprised of a monodisperse of carbon nanotubes 38 in an interstitial material 36 which is generally the same as the one loaded in vat 32 in the batch manufacturing embodiment shown in FIG. 3. Slurry 34 is dispensed from hopper 1192 through a control valve 1194 which acts in coordination with the movement of a conveyor 1196 to assure delivery of a layer of slurry 34 on conveyor 1196. As conveyor 1196 passes through a pair of plates 1197 and 1198 of a capacitor 1199 which are aligned and mounted above and below conveyor 1196, the spacing of the plates 1197 and 1198, in one embodiment, controls the thickness of the material. Plates 1197 and 1198 are connected to a voltage source 1200 to provide an electrostatic electrical field between the plates which forces the carbon nanotubes 38 into alignment with it. The material with its aligned nanotubes is transported by the conveyor 1196 from the plates 1197 and 1198 of capacitor 1199 to a curing station 1202.

In one embodiment, curing station 1202 is a curing lamp, such as an ultraviolet lamp which solidifies the polymeric material 36 of slurry 34. In another embodiment curing station 1202 delivers a chemical spray which hardens polymer 36. In both curing embodiments the degree to which the polymer is cured may be varied to provide, in one embodiment, a soft polymer which is advantageous for use as a thermal intermediate for mounting heat sinks to dies. In another embodiment, a harder polymer, which is more suitable to applications where the thermal intermediate is used under high pressure, further improves the heat transfer characteristics between the circuit or semiconductor die and the cooling solution or heat sink.

Figure 12:
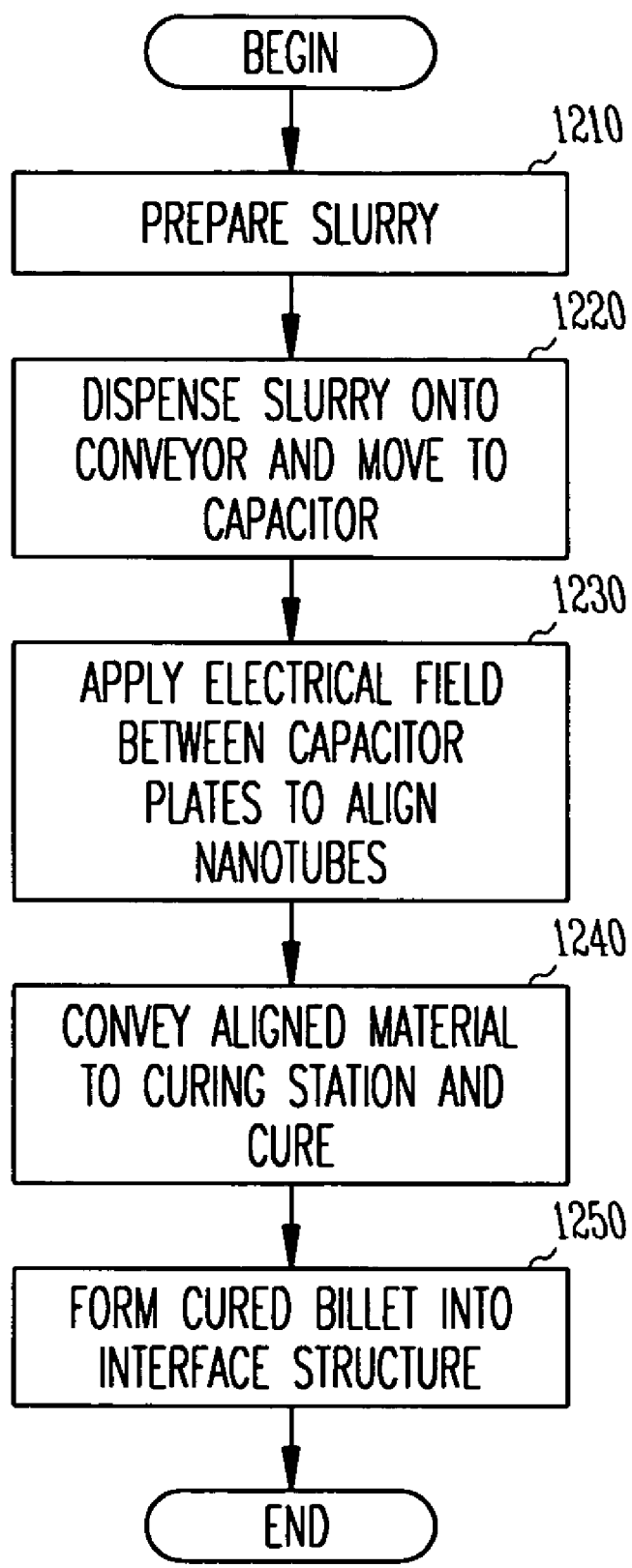
FIG. 12 is a process flow chart of the embodiment of the invention shown in FIG. 11.

FIG. 12 shows the process carried out in the apparatus shown in FIG. 11. Block 1210 is a preparation step where the slurry of carbon nanotubes and polymer is prepared in a manner similar to that shown for the embodiment described in FIGS. 3 through 10. The slurry is dispensed onto a conveyor in block 1220 and a field is applied between the plates of a capacitor bridging the conveyor and slurry in block 1230. After aligning the carbon nanotubes the conveyor in block 1240 moves the material to a curing area where it is cured and then proceeds to block 1250 where the cured billet is formed into a thermal interface structure having the desired dimensions.

It will be readily understood to those skilled in the art that various other changes in the details, material, and arrangements of the parts and method stages which have been described and illustrated in order to explain the nature of this invention may be made without departing from the principles and scope of the invention as expressed in the following claims.

What is claimed is:

1. An apparatus comprising:
   a slurry of carbon nanotubes in a liquid interstitial material;
   a capacitor that includes plates, the plates being adapted to receive a portion of the slurry between the plates at least one of the plates being adjustable such that a distance between the plates can be changed; and
   a voltage source to apply an electric field between the plates of the capacitor such that the electric field aligns nanotubes in the portion of the slurry that is between the plates to an orientation that is substantially perpendicular to the plates of the capacitor.

2. The apparatus of claim 1, also comprising:
   a vat to store the slurry of carbon nanotubes in a liquid interstitial material; and
   wherein the capacitor is movable into and out of the vat to receive a portion of the slurry between the plates, the capacitor being adjustable to vary the distance between the plates while immersed in the slurry.

3. The apparatus of claim 2 further comprising curing means to commence curing of the portion of the slurry between the plates after aligning the nanotubes in the portion of the slurry.

4. The apparatus of claim 1, wherein the liquid interstitial material is a liquid polymeric material.

* * * * *

UNITED STATES PATENT AND TRADEMARK OFFICE
CERTIFICATE OF CORRECTION

PATENT NO. : 7,704,462 B2
APPLICATION NO. : 11/104354
DATED : April 27, 2010
INVENTOR(S) : Stephen W. Montgomery et al.

It is certified that error appears in the above-identified patent and that said Letters Patent is hereby corrected as shown below:

In column 1, line 9, after "6,921,462" insert -- , --.

In column 6, line 5, in Claim 1, delete "plates" and insert -- plates, --, therefor.

Signed and Sealed this

Twenty-ninth Day of June, 2010

David J. Kappos
*Director of the United States Patent and Trademark Office*